(12) United States Patent
Kwak

(10) Patent No.: US 8,035,300 B2
(45) Date of Patent: Oct. 11, 2011

(54) FLAT PANEL DISPLAY DEVICE AND METHOD OF MAKING THE SAME

(75) Inventor: Won Kyu Kwak, Seongnam-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 842 days.

(21) Appl. No.: 11/640,709

(22) Filed: Dec. 18, 2006

(65) Prior Publication Data

US 2007/0176552 A1    Aug. 2, 2007

(30) Foreign Application Priority Data

Jan. 27, 2006   (KR) .................. 10-2006-0008808

(51) Int. Cl.
*H01J 1/62* (2006.01)
*H01J 63/04* (2006.01)

(52) U.S. Cl. ........ 313/512; 313/504; 257/787; 257/794; 349/58; 445/23; 445/24

(58) Field of Classification Search ........... 313/495–512
See application file for complete search history.

(56) References Cited

U.S. PATENT DOCUMENTS

| | | | |
|---|---|---|---|
| 5,953,094 A | 9/1999 | Matsuoka et al. | |
| 6,072,556 A | 6/2000 | Hirakata et al. | |
| 6,113,450 A | 9/2000 | Narayanan et al. | |
| 6,555,025 B1 | 4/2003 | Krupetsky et al. | |
| 6,632,116 B2 | 10/2003 | Watanabe et al. | |
| 6,913,501 B2 | 7/2005 | Hibino et al. | |
| 6,998,776 B2 | 2/2006 | Aitken et al. | |
| 2003/0094615 A1* | 5/2003 | Yamazaki et al. | ............... 257/72 |
| 2004/0075094 A1 | 4/2004 | Yamazaki et al. | |
| 2004/0169174 A1 | 9/2004 | Huh et al. | |
| 2004/0207314 A1* | 10/2004 | Aitken et al. | ................. 313/504 |
| 2005/0112408 A1 | 5/2005 | Kobayashi et al. | |

(Continued)

FOREIGN PATENT DOCUMENTS

CN           1577413           2/2005

(Continued)

OTHER PUBLICATIONS

Japanese Office Action issued on May 26, 2009 in the corresponding Japanese Patent Application No. 2006-232430.

(Continued)

*Primary Examiner* — Nimeshkumar Patel
*Assistant Examiner* — Thomas A Hollweg
(74) *Attorney, Agent, or Firm* — Knobbe Martens Olson & Bear LLP

(57) ABSTRACT

Disclosed is a method of making a flat panel display device. The flat panel display device includes a first substrate, an array of pixels formed on the first substrate, a second substrate opposing the first substrate, and a frit formed between the first substrate and the second substrate to encapsulate the array of pixels. On the first substrate, a buffer layer is formed, a first insulating film is formed on the buffer layer, and a first metal line is formed on the first insulating film. A second insulating film is formed, a second metal line is formed on the second insulating film, and a protective film formed on the upper of the second insulating film. A portion of the protective layer is etched to expose a portion of the second electrode. The frit overlaps with the portion of the second electrode.

20 Claims, 5 Drawing Sheets

U.S. PATENT DOCUMENTS

| | | |
|---|---|---|
| 2005/0184927 A1 | 8/2005 | Kwak |
| 2005/0190335 A1 | 9/2005 | Maruyama et al. |
| 2005/0233885 A1 | 10/2005 | Yoshida et al. |
| 2005/0248270 A1 | 11/2005 | Ghosh et al. |
| 2006/0267492 A1 | 11/2006 | Oh |
| 2007/0096633 A1 * | 5/2007 | Lee et al. .................. 313/500 |
| 2007/0114926 A1 | 5/2007 | Kijima et al. |
| 2007/0170850 A1 | 7/2007 | Choi et al. |
| 2007/0170859 A1 | 7/2007 | Choi et al. |
| 2007/0176548 A1 | 8/2007 | Kim et al. |
| 2007/0176551 A1 | 8/2007 | Kwak |
| 2007/0176563 A1 | 8/2007 | Kim et al. |
| 2007/0178796 A1 | 8/2007 | Kwak |
| 2007/0194710 A1 | 8/2007 | Song et al. |

FOREIGN PATENT DOCUMENTS

| | | |
|---|---|---|
| CN | 1622715 | 6/2005 |
| CN | 1713786 | 12/2005 |
| EP | 1176456 | 1/2002 |
| EP | 1503422 A2 | 2/2005 |
| EP | 1608032 A2 | 12/2005 |
| EP | 1811570 A2 | 7/2007 |
| JP | 2000 056319 | 2/2000 |
| JP | A 2005 07881 | 3/2005 |
| JP | 2005 108824 | 4/2005 |
| JP | 2005-338812 | 12/2005 |
| KR | 10-2003-0080895 | 10/2003 |
| KR | 10-2004-0002956 | 1/2004 |
| KR | 10-2004-0009841 A | 1/2004 |
| KR | 10-2006-0005369 A | 1/2006 |
| WO | WO2004 095597 | 11/2004 |

OTHER PUBLICATIONS

European Search Report dated Sep. 4, 2007 in related European patent application No. 07101235.

Notice of Allowance issued in the counterpart Korean Application No. 10-2006-0008808 in 2 pages.

European Search Report dated Sep. 24, 2007 from EP Application No. 07101243.9.

European Search Report dated Sep. 28, 2007 from EP Application No. 07101255.3.

Chinese Office Action dated Sep. 5, 2008 in Patent Application No. 200710007779.X.

Japanese Office Action issued on May 26, 2009 from Japanese Patent Application No. 2006-232431.

Notice of Allowance issued in Korean Application No. 10-2006-0008809.

Taiwanese Office Action dated Oct. 29, 2009 in Patent Application No. 95148351.

* cited by examiner

FLAT PANEL DISPLAY DEVICE AND METHOD OF MAKING THE SAME

CROSS-REFERENCE TO RELATED APPLICATIONS

This application claims the benefit of Korean Patent Application No. 10-2006-0008808, filed on Jan. 27, 2006, in the Korean Intellectual Property Office, the disclosure of which is incorporated herein by reference in its entirety. This application is related to and incorporates herein by reference the entire contents of the following concurrently filed applications:

| Title | Atty. Docket No. | Filing Date | Application No. |
|---|---|---|---|
| FLAT PANEL DISPLAY DEVICE AND METHOD OF MAKING THE SAME | SDISHN.076AUS | | |
| FLAT PANEL DISPLAY DEVICE AND METHOD OF MAKING THE SAME | SDISHN.090AUS | | |

BACKGROUND

1. Field of the Invention

The present invention relates to a flat panel display device, and more particularly, to encapsulating a flat panel display device.

2. Discussion of Related Technology

Recently, various flat panel display devices such as a liquid display device, an organic light-emitting display device, a PDP, a FED, etc. have been introduced. These flat panel display devices can be easily implemented in a large area and have therefore been greatly spotlighted. In general, such a flat panel display device has a structure that comprises a plurality of pixels on a substrate and covers the substrate with a metal cap or an encapsulating glass substrate to encapsulate it. In particular, an organic light-emitting display device using an organic light-emitting diode is sensitive to oxygen, hydrogen and moisture and thus, requires a more robust encapsulating structure so that oxygen, etc. cannot be infiltrated thereto.

A frit is formed in the form of a glass powder, if the temperature of heat applied to glass material is abruptly dropped. In general, it is used by adding oxide powder into glass powder. And, if the frit including oxide powder is added with organic substance, it becomes paste in a gel state. At this time, if the frit is burned at a predetermined temperature, organic material is vanished into air, and the paste in a gel state is cured so that the frit exists in a solid state. In U.S. Pat. No. 6,998,776 a structure to encapsulate an organic light-emitting diode by applying a frit to a glass substrate is disclosed.

The discussion in this section is to provide general background information, and does not constitute an admission of prior art.

SUMMARY

An aspect of the invention provides a display device, which may comprises: a first substrate; a second substrate opposing the first substrate; an insulating layer interposed between the first substrate and the second substrate; a protective layer interposed between the insulating layer and the second substrate; a first conductive line generally extending in a first direction and comprising a first portion, the first conductive line being buried between the first insulating layer and the first substrate; a second conductive line formed over the insulating layer, generally extending in the first direction and comprising a second portion, wherein the second conductive line has an width in the second portion thereof measured in a second direction, the second direction being perpendicular to the first direction, wherein the first portion of the first conductive line overlaps with the second portion of the second conductive line when viewed in a third direction from the first substrate, the third direction being perpendicular to the first and second directions; a frit seal interconnecting the first and second substrate, wherein the frit seal comprises a first portion interposed between the second substrate and the protective layer, wherein the frit seal comprises a second portion interposed between the second substrate and the second portion of the second conductive line, and wherein the second portion of the frit seal contacts the second portion of the second conductive line.

In the foregoing device, the protective layer may comprise a first portion, wherein the first portion of the protective layer is interposed between the frit seal and the insulating layer while not interposed between the frit seal and the second portion of the second conductive line, wherein the protective layer comprises a first surface in the first portion thereof, the first surface facing the second substrate, wherein the second conductive line comprises a second surface in the second portion thereof, the second surface contacting the frit seal, wherein the first surface has a first distance between the first surface and the surface of the first substrate, the first distance being measured in the third direction, wherein the second surface comprises a second distance between the second surface and the surface of the first substrate, the second distance being measured in the third direction, wherein the protective layer has a first thickness in the first portion thereof, the first thickness being measured in the third direction, wherein a difference between the first distance and the second distance may be equal to or smaller than about the first thickness. The difference may be equal to or smaller than about a half of the first thickness. The difference may be equal to or smaller than about a third of the first thickness. The difference may be equal to or less than about 3000 Å. The second surface may have a width in the second direction, wherein the width of the second surface may be smaller than the width of the second conductive line in the second portion thereof.

Another aspect of the invention provides a method of making a display device, which comprises: providing a first substrate comprising a substrate and a structure formed on the first substrate, the structure comprising a first conductive line, an insulating layer, a second conductive line and a protective layer, wherein the insulating layer is interposed between the first substrate and the protective layer, wherein the first conductive line is buried between the first substrate and the insulating layer, wherein the second conductive line is buried between the protective layer and the insulating layer, wherein the first conductive line generally extends in a first direction and comprises a first portion, wherein the second conductive line generally extends in the first direction comprises a second portion, the second conductive line having a width in the second portion thereof, the width being measured in a second direction perpendicular to the first direction, the first portion overlapping with the second portion when viewed in a third direction from the first substrate, the third direction being perpendicular to the first and second directions; selectively etching a portion of the structure so as to expose the second portion of the second conductive line; arranging a second substrate so as to oppose the first substrate; and interposing a frit between the first substrate and second substrate, wherein the frit comprises a first portion interposed between the protective layer and the second substrate, and wherein the frit comprises a second portion interposed between the second substrate and the second portion of the second conductive line. The second portion of the frit may contact the second portion of the second conductive line.

In the foregoing method, the protective layer comprises a first portion, wherein the first portion of the protective layer is interposed between the frit and the insulating layer while not interposed between the frit and the second portion of the second conductive line, wherein the protective layer comprises a first surface in the first portion thereof, the first surface facing the second substrate, wherein the second conductive line comprises a second surface in the second portion thereof, the second surface facing the second substrate, wherein the first surface has a first distance between the first surface and the surface of the first substrate, the first distance being measured in the third direction, wherein the second surface comprises a second distance between the second surface and the surface of the first substrate, the second distance being measured in the third direction, wherein the protective layer has a first thickness in the first portion thereof, the first thickness being measured in the third direction, and wherein a difference between the first distance and the second distance may be equal to or smaller than about the first thickness. The difference may be equal to or smaller than about a half of the first thickness. The difference may be equal to or smaller than about a third of the first thickness.

Still in the foregoing method, the protective layer comprises a first portion, wherein the first portion of the protective layer is interposed between the frit and the insulating layer while not interposed between the frit and the second portion of the second conductive line, wherein the protective layer comprises a first surface in the first portion thereof, the first surface facing the second substrate, wherein the second conductive line comprises a second surface in the second portion thereof, the second surface facing the second substrate, wherein the first surface has a first distance between the first surface and the surface of the first substrate, the first distance being measured in the third direction, wherein the second surface comprises a second distance between the second surface and the surface of the first substrate, the second distance being measured in the third direction, and wherein a difference between the first distance and the second distance may be equal to or less than about 3000 Å. The protective layer comprises a first portion, wherein the first portion of the protective layer is interposed between the frit and the insulating layer, wherein the first portion of the protective layer is not interposed between the frit and the second portion of the second conductive line, wherein the insulating layer has a second thickness in a portion thereof, the portion being interposed between the first portion of first conductive line and the second portion of the second conductive line, the second thickness being measured in the third direction, wherein the protective layer comprises a first surface in the first portion thereof, the first surface facing the second substrate, wherein the second conductive line comprises a second surface in the second portion thereof, the second surface facing the second substrate, wherein the first surface has a first distance between the first surface and the surface of the first substrate, the first distance being measured in the third direction, wherein the second surface comprises a second distance between the second surface and the surface of the first substrate, the second distance being measured in the third direction, wherein a difference between the first distance and the second distance may be equal to or smaller than about the second thickness. The difference may be equal to or smaller than about a half of the second thickness. The difference may be equal to or smaller than about a third of the second thickness.

Further in the foregoing method, the frit may comprise an elongated segment overlapping with the second portion of the second conductive line, the elongated segment generally extending along the second direction. The frit may contact the second portion of the second conductive line substantially throughout the entire width of the second conductive line in the second portion thereof. The etched portion of the structure may have a width measured in the second direction, wherein the width of the etched portion may be greater than the width of the second conductive line in the second portion. The etched portion of the structure may have a width measured in the second direction, wherein the width of the etched portion may be less than the width of the second conductive line in the second portion. The structure further may comprise another insulating layer, wherein the other insulating layer may be interposed between the insulating layer and the first substrate, wherein the first conductive line may be buried between the insulating layer and the other insulating layer. Interposing the frit may comprise forming the frit one of the first and second substrates and arranging the first and second substrates such that the frit is interposed between the first and second substrates.

Still another aspect of the invention provides a flat panel display device comprising: a first substrate divided into a pixel region including a pixel and a non-pixel region other than the pixel region; a second substrate opposed to a predetermined region including the pixel region on the first substrate; and a frit formed between the first substrate and the second substrate to encapsulate the first substrate and the second substrate, wherein the non-pixel region of the first substrate comprises a transparent substrate on which a buffer layer is formed, a first insulating film formed on the buffer layer, a first metal film patterned and formed on the upper of the first insulating film, a second metal film formed on the first insulating film, and a protective film formed on the upper of the second insulating film.

Further aspect provides a method of fabricating a flat panel display device comprising a pixel region and a non-pixel region other than the pixel region and displaying an image by using the pixel, the method comprising the steps of: forming a first insulating film on a first substrate on which a buffer layer is formed, and patterning and forming a first metal film on the upper of the first insulating film; depositing a second insulating film on the upper of the first insulating film on which the first metal film is formed, and patterning and forming a second metal film on the upper of the second insulating film; forming a protective film on the upper of the second insulating film on which the second metal film is formed; etching a region that the height of the upper end of the protective film is high; and encapsulating the first substrate with a second substrate by using a frit.

BRIEF DESCRIPTION OF THE DRAWINGS

These and other aspects and advantages of the invention will become apparent and more readily appreciated from the following description of the embodiments, taken in conjunction with the accompanying drawings of which.

DETAILED DESCRIPTION OF EMBODIMENTS

Hereinafter, various embodiments of the present invention will be described in a more detailed manner with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 5A:
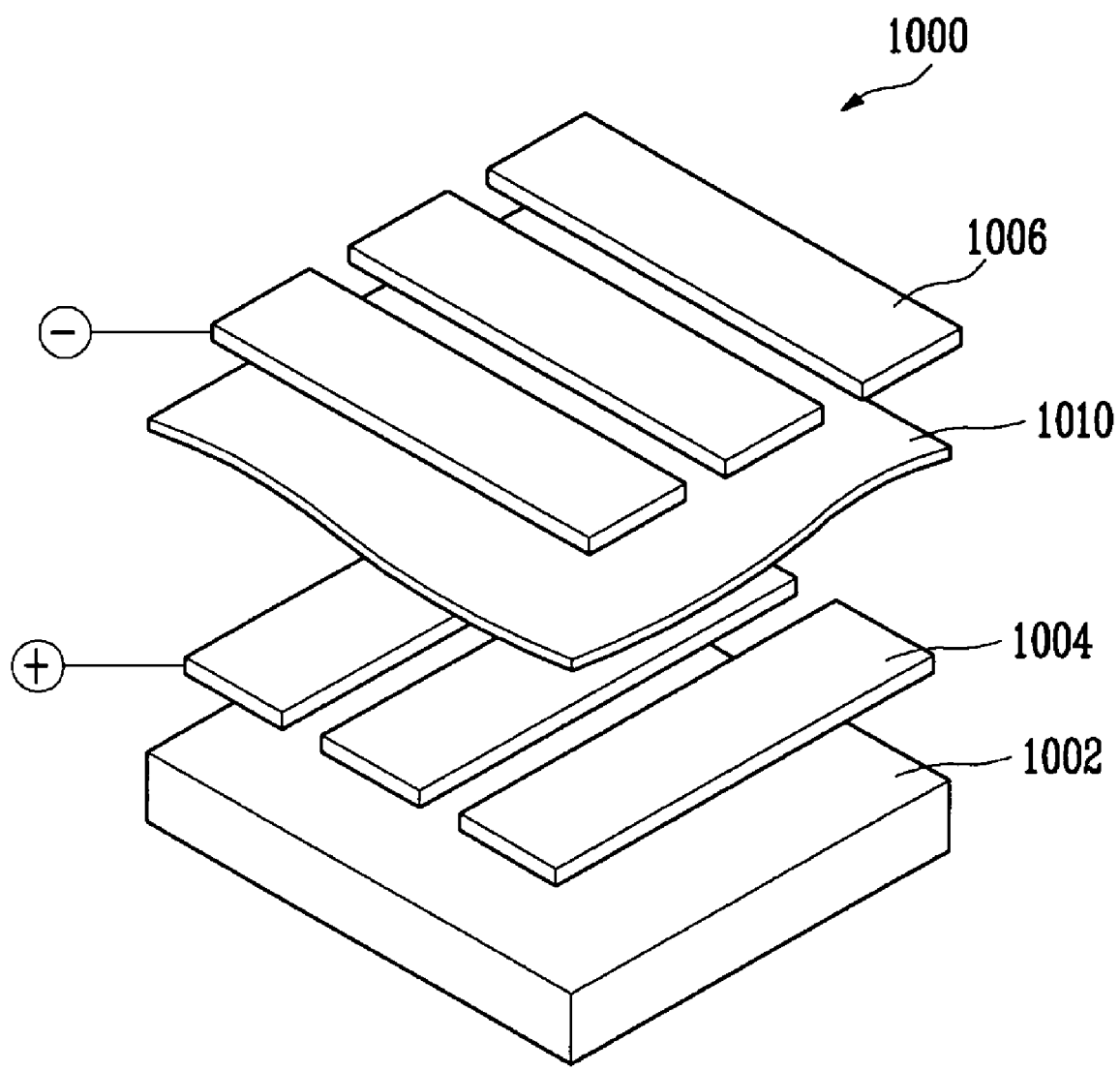
FIG. 5A is a schematic exploded view of a passive matrix type organic light emitting display device in accordance with one embodiment.
Figure 5B:
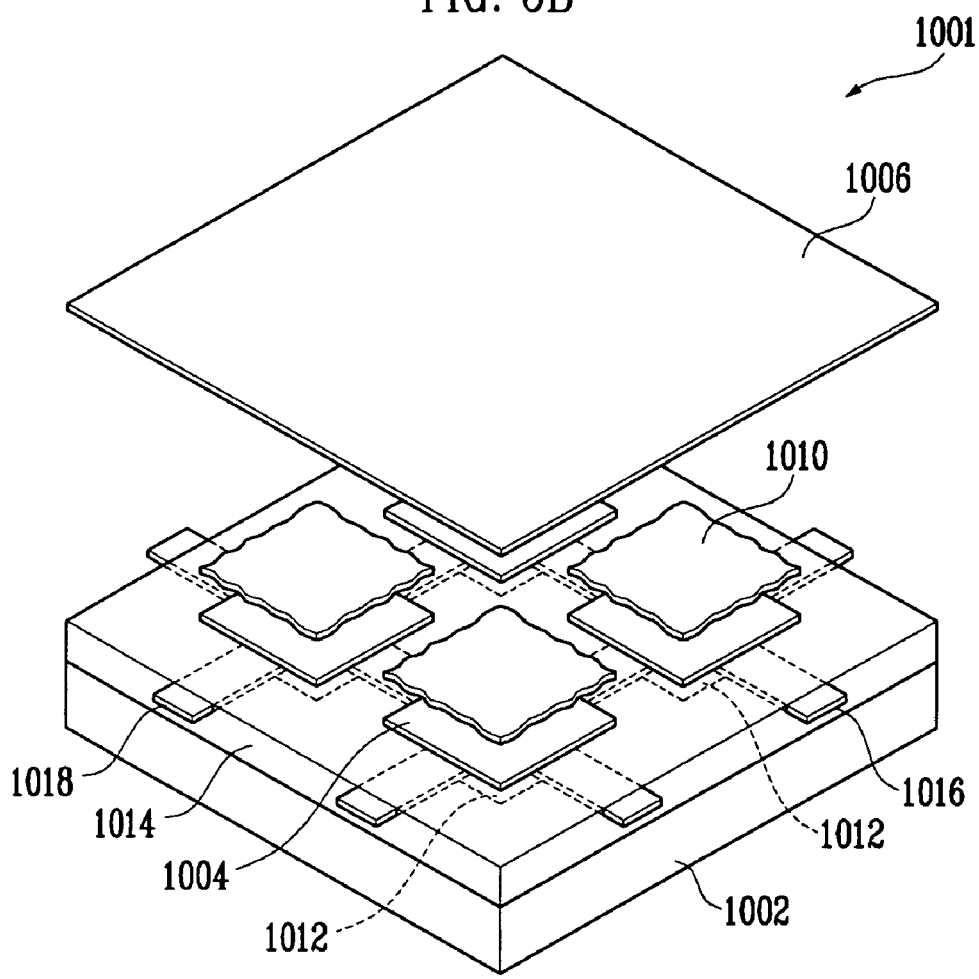
FIG. 5B is a schematic exploded view of an active matrix type organic light emitting display device in accordance with one embodiment.

OLEDs can be generally grouped into two basic types dependent on the arrangement with which the stimulating electrical current is provided. FIG. 5A schematically illustrates an exploded view of a simplified structure of a passive matrix type OLED 1000. FIG. 5B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 5A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 5B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 5C:
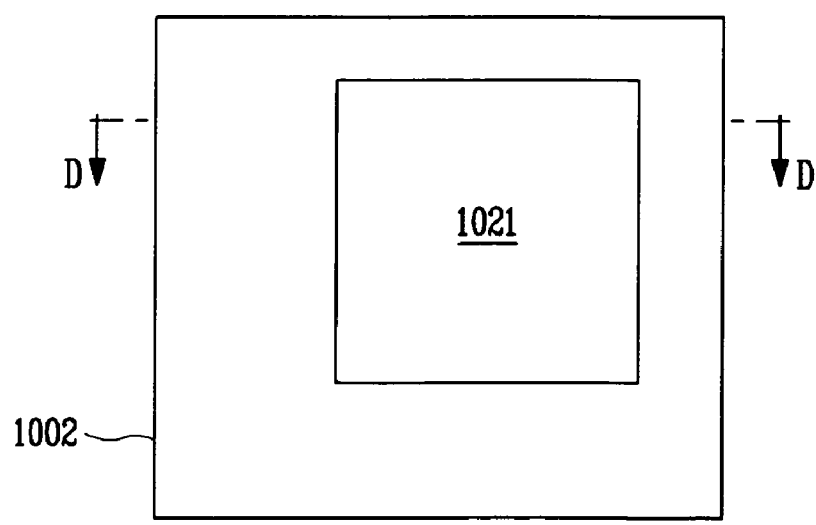
FIG. 5C is a schematic top plan view of an organic light emitting display in accordance with one embodiment.

In many embodiments, an OLED pixel array 1021 comprising a plurality of organic light emitting pixels is arranged over a substrate 1002 as shown in FIG. 5C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 5D:
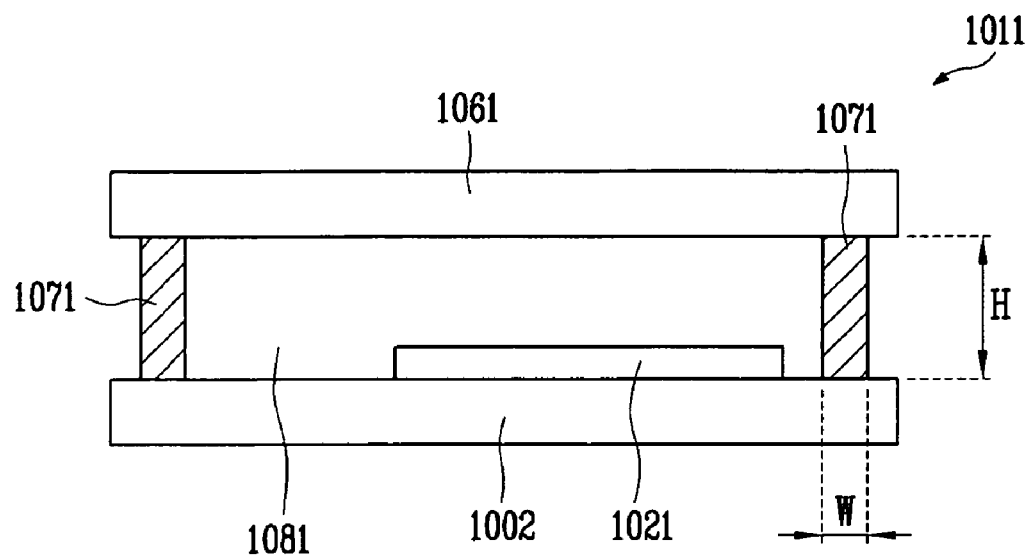
FIG. 5D is a cross-sectional view of the organic light emitting display of FIG. 5C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 5D schematically illustrates a cross-section of an encapsulated OLED device 1011 having a layout of FIG. 5C and taken along the line d-d of FIG. 5C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 5D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 5D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% F inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 5E:
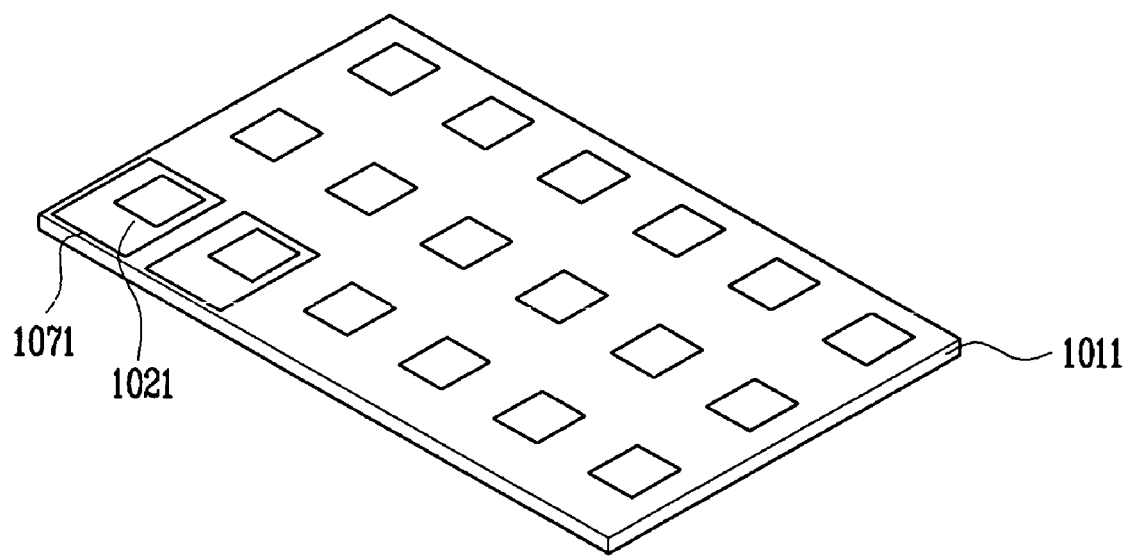
FIG. 5E is a schematic perspective view illustrating mass production of organic light emitting devices in accordance with one embodiment.

In some embodiments, OLED devices 1011 are mass produced. In an embodiment illustrated in FIG. 5E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 5D. In certain embodiments, the individual OLED devices 1011 then further undergo additional packaging operations to further improve the sealing formed by the frit seal 1071 and the top and bottom substrates 1061, 1002.

Figure 1:
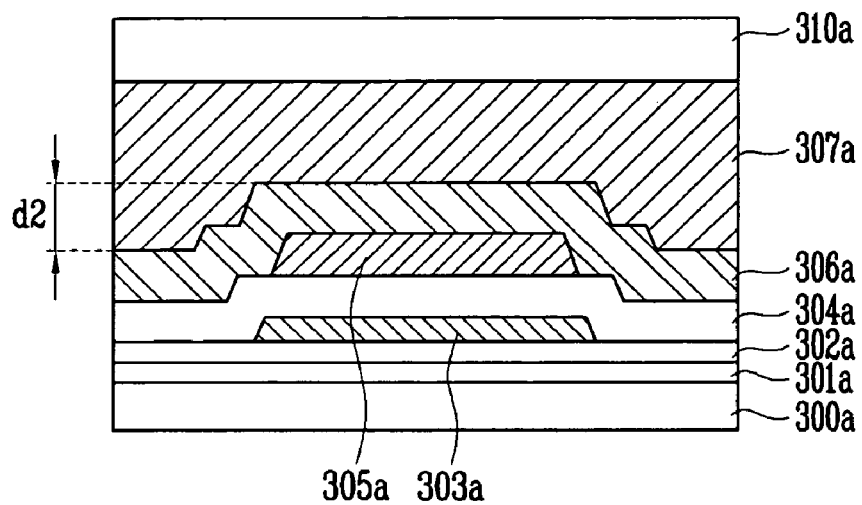
FIG. 1 is a cross-sectional view for showing a cross-section of a state that a first substrate and a second substrate are encapsulated by using a frit in an exemplary flat panel display device.

FIG. 1 is a cross-sectional view showing a state that a first substrate and a second substrate are encapsulated by using a frit in an exemplary flat display device. Referring to FIG. 1, a cross-section of a non light-emitting region is shown. The substrate has a structure that a buffer layer 301*a* is applied on the upper of a transparent substrate 300*a*, a first insulating film 302*a* is applied on the upper of the buffer layer 301*a*, and a first metal film 303*a* is patterned and formed on the upper of the first insulation film 302*a*. And, on the upper of the first insulating film 302*a* on which the first metal film 303*a* is formed, a second insulating film 304*a* is applied. The first insulating film 302*a* and the second insulating film 304*a* are formed on a nonlight-emitting region by extending an organic film, etc., used during forming pixels deposited on a light emitting region and the first metal film 303a is formed similar to a metal layer transferring signals to pixels in a light-emitting region. And, on the upper of the second insulating film 304a a second metal film 305a is formed. At this time, the first metal film 303a and the second metal film 305a are a mutual intersecting wire. And, at least one of the first metal film 303a and the second metal film 305a is used as a wire transferring signal and voltage to the pixel region. As an example, it includes a scan line transferring a scan signal, a data line transferring a data signal and a pixel power source line transferring a pixel power source, etc. And, a protective film 306a is formed on the upper of the second insulating film 304a on which the second metal film 305a is formed. A step height or distance d2 is generated on the protective film 306a by means of the first metal film 303a and the second metal film 305a and corresponds to the sum of the thickness of the first metal film 303a and the thickness of the second metal film 305a. If the thickness of the first insulating film 302a is about 1200 Å, the thickness of the first metal film 303a is about 2000 Å, the thickness Of the second insulating layer 304a is about 5000 Å, the thickness of the second metal film 305a is about 5000 Å and the thickness of the protective film 306a is about 6000 Å, the distance d2 corresponds to the sum of the thickness of first metal film 303a and the thickness of the second metal film 305a.

And, after a frit 307a is formed on the second substrate 310a and the second substrate 310a is coupled with the first substrate, a sealing process for encapsulating the first substrate and the second substrate 310 with the frit 307a is performed by applying laser or infrared rays, etc., to the frit 307a. When encapsulating the second substrate 301a and the first substrate by using the frit 307a due to the distance d2 of the lower of the frit 307a, the frit 307a in a solid state is contacted with only the high portion of the protective film 306a. Under the circumstance, if the frit 307a is heated to have viscosity, the time that heat is applied to the high portion of the protective film 306a is longer than the time that heat is applied to the lower portion thereof, resulting in that the first metal film 303a and the second metal film 305a located beneath the lower thereof may be damaged by heat generated during encapsulating first substrate and the second substrate 310a with the frit 307a.

Figure 2:
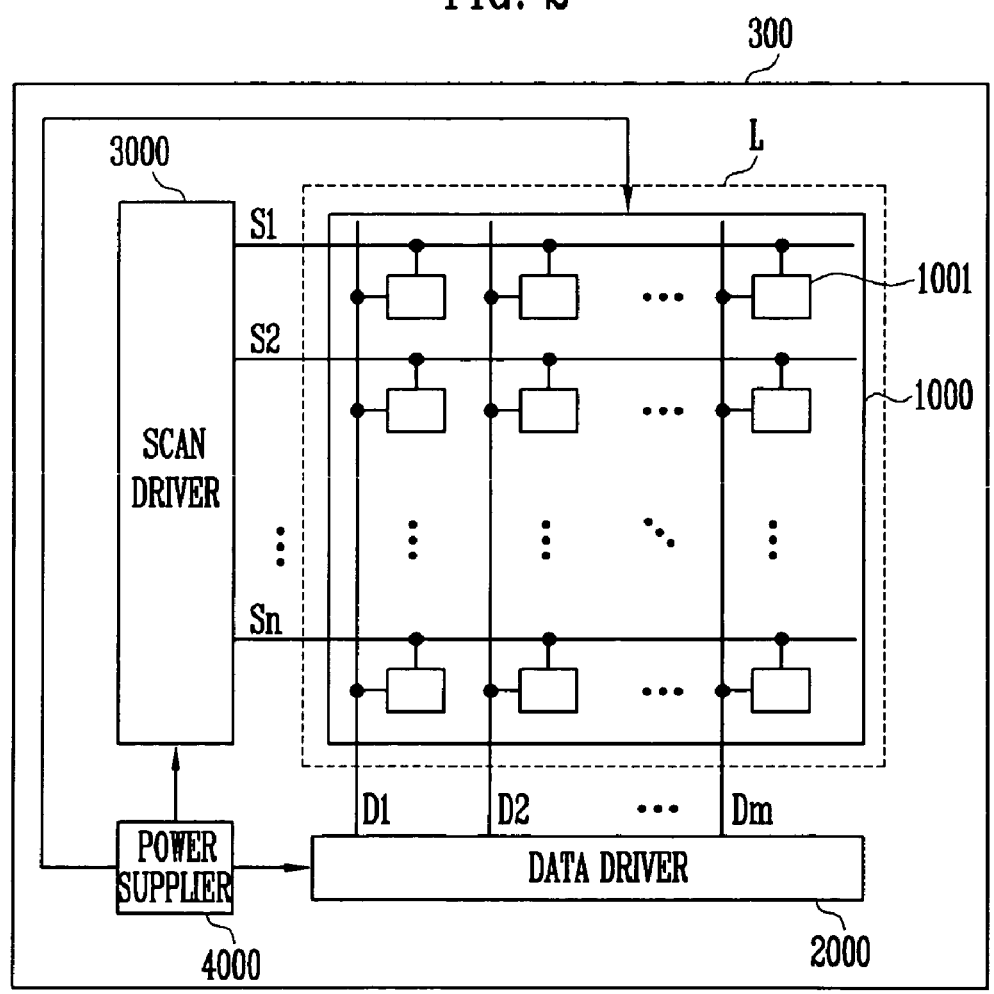
FIG. 2 is a structural view for showing a structure of a flat panel display device according to an embodiment of the present invention.

FIG. 2 is a structural view for showing a structure of a flat panel display device according to an embodiment of the present invention. Referring to FIG. 2, the flat panel display device comprises a substrate 1900, a data driver 2000, a scan driver 3000, and a power supplier 4000. The substrate 1900 is formed by opposing a first substrate 300 on which a pixel 1001 is formed to a second substrate sealing the first substrate at a predetermined distance. The first substrate is divided into a pixel region and a non-pixel region, and the second substrate is formed to be wider than the pixel region and the portion thereof shown in dotted line L is formed with a frit, thereby encapsulating the first substrate and the second substrate with the frit. Also, the first substrate is provided with a data line, a scan line and a power line, etc., and can thus receive a data signal, a scan signal and power, etc. from the external.

The data driver 2000 connected to data lines generates data signals and transfers the data signals via the data lines At this time, the data lines are formed on the upper of the first substrate so that the data lines pass through the lower of the frit. The scan driver 3000 connected to scan lines generates scan signals and transfers the scan signals via the scan lines. At this time, the scan lines are formed on the upper of the first substrate so that the scan lines pass through the lower of the frit. The power supplier 4000 transfers driving voltage to the substrate, the data driver, and the scan driver, etc. to drive the substrate, the data driver, and the scan driver, etc. At this time, a power line is formed on the upper of the first substrate so that the power line passes through the lower of the frit.

Figure 3:
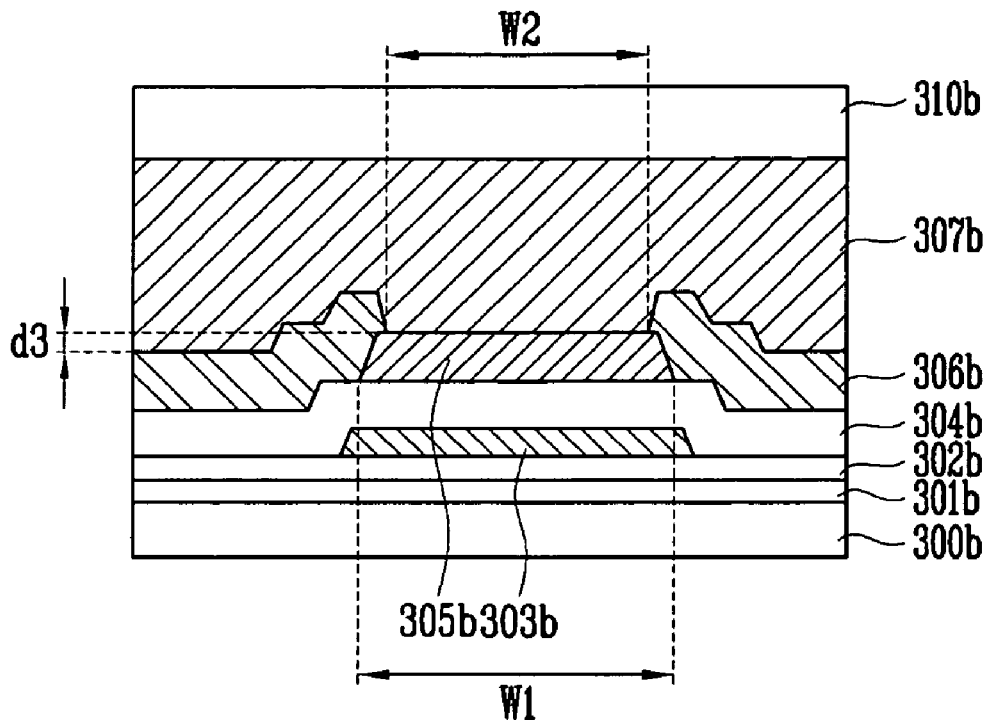
FIG. 3 is a cross-sectional view for showing a cross-section of the flat panel display substrate shown in FIG. 2.

FIG. 3 is a cross-sectional view for showing a cross-section of the flat panel display substrate shown in FIG. 2. Referring to FIG. 3, there is shown a cross-section of a nonlight-emitting region of the substrate. In certain embodiments, a buffer layer 301b is formed on a transparent substrate 300b, a first insulating film 302b is formed on the buffer layer 301b, and a first metal film or conductive line 303b is patterned and formed on the first insulation film 302b. The first conductive line 303b extends generally along a first direction. And, on the first insulating film 302b on which the first metal film 303b is formed, a second insulating film 304b is formed. The first insulating film 302b and the second insulating film 304b are formed on a nonlight-emitting region by extending an organic film, etc., used during forming pixels deposited on a light emitting region and the first metal film 303b is formed similar to a metal layer transferring signals to pixels in a light-emitting region.

On the second insulating film 304b a second metal film or conductive line 305b is formed. The second conductive line 305b generally extends along the first direction and has a width W1 measure in a second direction perpendicular to the first direction. In some embodiments, the first metal film 303b and the second metal film 305b are a mutual intersecting wire. And, at least one of the first metal film 303b and the second metal film 305b is used as a wire transferring signal and voltage to the pixel region. As an example, it includes a scan line transferring a scan signal, a data line transferring a data signal and a pixel power source line transferring a pixel power source, etc. And, a protective film 306b is formed on the second insulating film 304b on which the second metal film 305b is formed. A step or elevated portion is generated on the protective film 306b by means of the first metal film 303b and the second metal film 305b so that the height of the portion on which the first metal film 303b and the second metal film 305b are formed becomes high. In order to reduce the distance, the portion of the protective film 306b, that is, the portion located on which the first metal film 303b and the second metal film 305b is etched. Therefore, the distance d3 is reduced by the portion etched. If the thickness of the first insulating film 302a is about 1200 Å, the thickness of the first metal film 303a is about 2000 Å, the thickness of the second insulating layer 304a is about 5000 Å, the thickness of the second metal film 305a is about 5000 Å and the thickness of the protective film 306a is about 6000 Å, the distance d3 reduces to the extent of about 1000 Å and is reduced by the thickness of the protective film 306b.

In certain embodiments, the distance d3 is about 0, 10, 20, 30, 40, 50, 60, 70, 80, 90, 100, 150, 200, 250, 300, 400, 500, 700, 1000, 1500, 2000, 2500, 3000 or 3500 Å. In some embodiments, the distance d3 may be within a range defined by two of the foregoing distances. In certain embodiments, the ratio of the distance d3 to a thickness of the protective layer is about 0.001, 0.002, 0.005, 0.01, 0.02, 0.05, 0.1, 0.2, 0.3, 0.4, 0.5, 0.7 or 1.0. In some embodiments, the ratio of the distance d3 to a thickness of the protective layer may be within a range defined by two of the foregoing numerals. In certain embodiments, the ratio of the distance d3 to a thickness of the second insulating layer is about 0.001, 0.002, 0.005, 0.01, 0.02, 0.05, 0.1, 0.2, 0.3, 0.4, 0.5, 0.7 or 1.0. In some embodiments, the ratio of the distance d3 to the thickness of the second insulating layer may be within a range defined by two of the foregoing numerals.

And, after a frit 307b is formed on the second substrate 310b and the second substrate 310b is coupled with the first substrate, a sealing process for encapsulating the first substrate and the second substrate 310 with the frit 307a is performed by applying laser or infrared rays, etc., to the frit 307b. When encapsulating the second substrate 301b and the first substrate by using the frit 307b due to the distance d3 of the lower of the frit 307b, the frit 307b in a solid state is contacted with the region on which the second metal film is formed and the region on which the protective film is formed, because the frit 307b does not have the distance d3 in the protective film 306b, differently from FIG. 1, wherein the regions exist in the lower of the frit. Under the circumstance, the frit 307b is heated by laser or infrared rays to have viscosity, wherein the heat applied to the frit 307b has a range about between about 300° C. and about 500'. At this time, since the lower of the frit 307b does not have the step, the contacted area of the frit and the protective becomes large, thereby transferring the heat generated from the frit to larger area. In particular, although the case that the metal film is directly contacted with the frit is generated, since heat is transferred to even portions other than the portion on which the metal film is formed, the metal film located beneath the lower of the frit can be protected from the heat generated from the frit.

Figure 4:
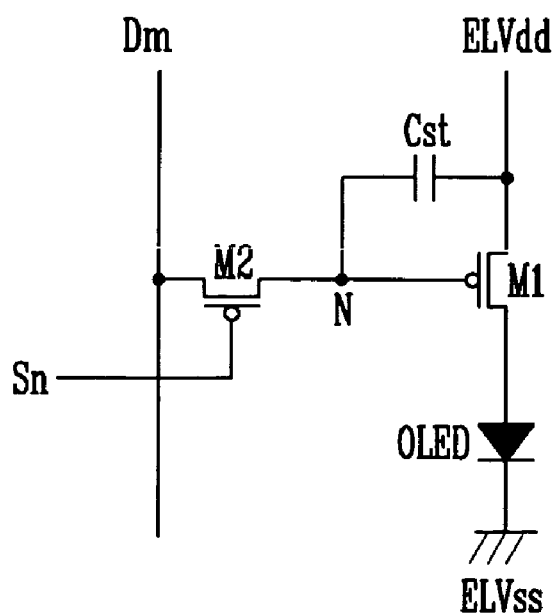
FIG. 4 is a circuit view for showing one example of a pixel in case that a flat panel display device according to an embodiment of the present invention is an organic light-emitting display device.

FIG. 4 is a circuit view for showing one example of a pixel in case that a flat panel display device according to an embodiment of the present invention is an organic light-emitting display device. Referring to FIG. 4, a pixel comprises an organic light emitting device (Organic Light Emitting Device: OLED), a first transistor (Thin Film Transistor: M1), a second transistor M2 and a capacitor Cst. And, a scan line Sn, a data line Dm and a power line ELVdd are connected to pixels. And, the scan line is formed in a row direction, and the data line Dm and the power line ELVdd are formed in a column direction. The first transistor M1 has a structure that a source electrode is connected to a pixel power line Vdd, a drain electrode is connected to the OLED, and a gate electrode is connected to a first node N. And, current for light-emitting is supplied to the organic light-emitting element OLED by a signal input into the gate electrode. The amount of current flowing from the source to the drain of the first transistor M1 is controlled by the data signal applied via the second transistor M2.

The second transistor M2 has a structure that a source electrode is connected to the data line Dm, a drain electrode is connected to the first node N, and a gate electrode is connected to the scan line Sn, thereby performing a switching operation by a scan signal transferred via the scan line Sn and selectively transferring the data signal transferred via the data line Dm to the first node N. The capacitor Cst has a structure that a first electrode is connected to a source electrode of the first transistor M1, and a second electrode is connected to the first node N, thereby maintaining voltage applied between the source electrode and the gate electrode for a certain period by the data signal. With the above constitution, when the second transistor M2 is on by the scan signal applied to the gate electrode of the second transistor M2, the voltage corresponding to the data signal is charged in the capacitor Cst and the voltage charged in the capacitor Cst is applied to the gate electrode of the first transistor M1, so that the first transistor M1 allows the flow of current to light-emit the organic light-emitting element OLED.

With the flat panel display device and the method of the same according to embodiments of the present invention, since the elevated portion below the frit becomes low, the damage on the metal film by heat can be reduced, preventing the generation of cracks, etc. on the metal film, and since the lower contacting face of the frit is flat, the adhesion of the frit can be improved, more securely sealing a upper substrate and a lower substrate.

Although various embodiments of the present invention have been shown and described, it would be appreciated by those skilled in the art that changes might be made in this embodiment without departing from the principles and spirit of the invention, the scope of which is defined in the claims and their equivalents.

What is claimed is:
1. A display device comprising:
a first substrate;
a second substrate opposing the first substrate;
an insulating layer interposed between the first substrate and the second substrate;
a protective layer interposed between the insulating layer and the second substrate;
a first conductive line generally extending in a first direction and comprising a first portion, the first conductive line being buried between the insulating layer and the first substrate, wherein the insulating layer extends continuously over the first conductive line;
a second conductive line formed over the insulating layer, generally extending in the first direction and comprising a second portion, wherein the second conductive line has a width in the second portion thereof measured in a second direction, the second direction being perpendicular to the first direction, wherein the first portion of the first conductive line overlaps with the second portion of the second conductive line when viewed in a third direction from the first substrate, the third direction being perpendicular to the first and second directions; and
a frit seal interconnecting the first and second substrate, wherein the frit seal comprises a first portion interposed between the second substrate and the protective layer, wherein the frit seal comprises a second portion interposed between the second substrate and the second portion of the second conductive line, and wherein the second portion of the frit seal contacts the second portion of the second conductive line,
wherein the protective layer comprises a first portion, wherein the first portion of the protective layer is interposed between the frit seal and the insulating layer while not interposed between the frit seal and the second portion of the second conductive line, wherein the protective layer comprises a first surface in the first portion thereof, the first surface facing the second substrate, wherein the second conductive line comprises a second surface in the second portion thereof, the second surface contacting the frit seal, wherein the first surface has a first distance between the first surface and the surface of the first substrate, the first distance being measured in the third direction, wherein the second surface comprises a second distance between the second surface and the surface of the first substrate, the second distance being measured in the third direction, wherein the protective layer has a first thickness in the first portion thereof, the first thickness being measured in the third direction, and wherein a difference between the first distance and the second distance is equal to or smaller than about the first thickness.

2. The device of claim 1, wherein the difference is equal to or smaller than about a half of the first thickness.

3. The device of claim 1, wherein the difference is equal to or smaller than about a third of the first thickness.

4. The device of claim 1, wherein the difference is equal to or less than about 3000 Å.

5. The device of claim 1, wherein the second surface has a width in the second direction, and wherein the width of the second surface is smaller than the width of the second conductive line in the second portion thereof.

6. A method of making the display device of claim 1, the method comprising:
providing the first substrate comprising a structure formed on the first substrate, the structure comprising the first conductive line, the insulating layer, the second conductive line and the protective layer, wherein the insulating layer is interposed between the first substrate and the protective layer, wherein the first conductive line is buried between the first substrate and the insulating layer, and wherein the second conductive line is buried between the protective layer and the insulating layer;
selectively etching a portion of the structure so as to expose the second portion of the second conductive line;
arranging the second substrate so as to oppose the first substrate; and
interposing a frit between the first substrate and second substrate, wherein the frit comprises a first portion interposed between the protective layer and the second substrate, and wherein the frit comprises a second portion interposed between the second substrate and the second portion of the second conductive line.

7. The method of claim 6, wherein the second portion of the frit contacts the second portion of the second conductive line.

8. The method of claim 6, wherein the protective layer comprises a first portion, wherein the first portion of the protective layer is interposed between the frit and the insulating layer while not interposed between the frit and the second portion of the second conductive line, wherein the protective layer comprises a first surface in the first portion thereof, the first surface facing the second substrate, wherein the second conductive line comprises a second surface in the second portion thereof, the second surface facing the second substrate, wherein the first surface has a first distance between the first surface and the surface of the first substrate, the first distance being measured in the third direction, wherein the second surface comprises a second distance between the second surface and the surface of the first substrate, the second distance being measured in the third direction, wherein the protective layer has a first thickness in the first portion thereof, the first thickness being measured in the third direction, wherein a difference between the first distance and the second distance is equal to or smaller than about the first thickness.

9. The method of claim 8, wherein the difference is equal to or smaller than about a half of the first thickness.

10. The method of claim 8, wherein the difference is equal to or smaller than about a third of the first thickness.

11. The method of claim 6, wherein the protective layer comprises a first portion, wherein the first portion of the protective layer is interposed between the frit and the insulating layer while not interposed between the frit and the second portion of the second conductive line, wherein the protective layer comprises a first surface in the first portion thereof, the first surface facing the second substrate, wherein the second conductive line comprises a second surface in the second portion thereof, the second surface facing the second substrate, wherein the first surface has a first distance between the first surface and the surface of the first substrate, the first distance being measured in the third direction, wherein the second surface comprises a second distance between the second surface and the surface of the first substrate, the second distance being measured in the third direction, and wherein a difference between the first distance and the second distance is equal to or less than about 3000 Å.

12. The method of claim 6, wherein the protective layer comprises a first portion, wherein the first portion of the protective layer is interposed between the frit and the insulating layer, wherein the first portion of the protective layer is not interposed between the frit and the second portion of the second conductive line, wherein the protective layer comprises a first surface in the first portion thereof, the first surface facing the second substrate, wherein the second conductive line comprises a second surface in the second portion thereof, the second surface facing the second substrate, wherein the first surface has a first distance between the first surface and the surface of the first substrate, the first distance being measured in the third direction, wherein the second surface comprises a second distance between the second surface and the surface of the first substrate, the second distance being measured in the third direction, wherein the insulating layer has a second thickness in a portion thereof, the portion being interposed between the first portion of first conductive line and the second portion of the second conductive line, the second thickness being measured in the third direction, and wherein a difference between the first distance and the second distance is equal to or smaller than about the second thickness.

13. The method of claim 12, wherein the difference is equal to or smaller than about a half of the second thickness.

14. The method of claim 12, wherein the difference is equal to or smaller than about a third of the second thickness.

15. The method of claim 6, wherein the frit comprises an elongated segment overlapping with the second portion of the second conductive line, the elongated segment generally extending along the second direction.

16. The method of claim 6, wherein the frit contacts the second portion of the second conductive line substantially throughout the entire width of the second conductive line in the second portion thereof.

17. The method of claim 6, wherein the etched portion of the structure has a width measured in the second direction, wherein the width of the etched portion is greater than the width of the second conductive line in the second portion.

18. The method of claim 6, wherein the etched portion of the structure has a width measured in the second direction, wherein the width of the etched portion is less than the width of the second conductive line in the second portion.

19. The method of claim 6, wherein the structure further comprises another insulating layer, wherein the other insulating layer is interposed between the insulating layer and the first substrate, wherein the first conductive line is buried between the insulating layer and the other insulating layer.

20. The method of claim 6, wherein interposing the frit comprises forming the frit one of the first and second substrates and arranging the first and second substrates such that the frit is interposed between the first and second substrates.

* * * * *

UNITED STATES PATENT AND TRADEMARK OFFICE
CERTIFICATE OF CORRECTION

PATENT NO.       : 8,035,300 B2                          Page 1 of 1
APPLICATION NO.  : 11/640709
DATED            : October 11, 2011
INVENTOR(S)      : Won Kyu Kwak It is certified that error appears in the above-identified patent and that said Letters Patent is hereby corrected as shown below:

At column 8, line 31, please delete "life time" and insert --lifetime--, therefor.

At column 9, line 59, after "70-90%" delete "F".

At column 10, line 10, please delete "butyl cellusolve," and insert --butyl cellosolve,--, therefor.

At column 11, line 20, after "thickness", please delete "Of" and insert --of--, therefor.

At column 13, line 14, please delete "500'." and insert --500° C.--, therefor.

Signed and Sealed this
Fourth Day of September, 2012

David J. Kappos
*Director of the United States Patent and Trademark Office*